United States Patent
Oh

(10) Patent No.: US 8,803,327 B2
(45) Date of Patent: Aug. 12, 2014

(54) SEMICONDUCTOR PACKAGE

(71) Applicant: SK hynix Inc., Icheon-si (KR)

(72) Inventor: Tac Keun Oh, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/693,458

(22) Filed: Dec. 4, 2012

(65) Prior Publication Data

US 2013/0292844 A1    Nov. 7, 2013

(30) Foreign Application Priority Data

May 4, 2012   (KR) .................. 10-2012-0047378

(51) Int. Cl.
*H01L 29/40* (2006.01)

(52) U.S. Cl.
USPC .............. 257/774; 257/757; 257/E21.499; 257/E23.01

(58) Field of Classification Search
USPC ......... 257/E21.499, 774, 757, E23.01, 777, 257/E23.011, E23.068; 438/107, 109
See application file for complete search history.

(56) References Cited

U.S. PATENT DOCUMENTS 8,106,520 B2 *   1/2012   Keeth et al. ................. 257/777
2011/0291288 A1 *  12/2011   Wu et al. ................... 257/774

* cited by examiner

*Primary Examiner* — Zandra Smith
*Assistant Examiner* — Paul Patton
(74) *Attorney, Agent, or Firm* — William Park & Associates Patent Ltd.

(57) ABSTRACT

A semiconductor package includes a first interposer; first and second semiconductor chips horizontally mounted over the first interposer and electrically connected with the first interposer; and a second interposer disposed over the first and second semiconductor chips and electrically connected with the first and second semiconductor chips, wherein the first semiconductor chip includes a plurality of first through electrodes, and the second semiconductor chip includes a plurality of second through electrodes, and wherein the first through electrodes of the first semiconductor chip and the second through electrodes of the second semiconductor chip are electrically connected with each other through the first and second interposers.

19 Claims, 9 Drawing Sheets

SEMICONDUCTOR PACKAGE

CROSS-REFERENCE TO RELATED APPLICATION

The present application claims priority under 35 U.S.C. 119(a) to Korean Patent Application Number 10-2012-0047378 filed in the Korean Intellectual Property Office on May 4, 2012, which is incorporated herein by reference in its entirety.

BACKGROUND OF THE INVENTION

1. Field of the Invention

The present invention generally relates to a semiconductor package, and more particularly, to a semiconductor package which is suitable for multi-functionality and high integration.

2. Description of the Related Art

As electronic products are miniaturized, the sizes of packages used in the electronic products have been shrunken, and as various and complex application products are developed, packages capable of performing various functions have been demanded. Under this situation, a system-in-package, in which semiconductor chips with different functions, for example, a system chip, such as a CPU (central processing unit) and a GPU (graphic processing unit), and a memory chip are enclosed in one package to realize a system, is gaining popularity.

As an example of the system-in-package, a structure in which a system chip and a memory chip are horizontally mounted on an interposer and signal transfer between the system chip and the memory chip is implemented through wiring lines formed on the upper surface of the interposer has been suggested.

In order to accommodate the trend toward multi-functionality and high integration, the numbers of inputs/outputs of the system chip and memory chip have been increased and thus the number of wiring lines for signal transfer between the system chip and the memory chip has been increased. In this regard, since the number of wiring lines capable of being formed on the upper surface of the interposer has a limitation, difficulties exist in achieving the multi-functionality and high integration.

While a method of increasing the size of the interposer to enlarge an area for forming wiring lines and a method of thinly forming wiring lines to increase the number of wiring lines to be formed in a unit area have been disclosed, warping may occur when the size of the interposer is increased, and a precise wiring process is required to thinly form the wiring lines, by which the manufacturing cost is likely to rise.

BRIEF SUMMARY OF THE INVENTION

An embodiment may be directed to a semiconductor package which is suitable for multi-functionality and high integration.

In an embodiment, a semiconductor package includes: a first interposer; first and second semiconductor chips horizontally mounted over the first interposer and electrically connected with the first interposer; and a second interposer disposed over the first and second semiconductor chips and electrically connected with the first and second semiconductor chips, wherein the first semiconductor chip includes a plurality of first through electrodes, and the second semiconductor chip includes a plurality of second through electrodes, and wherein the first through electrodes of the first semiconductor chip and the second through electrodes of the second semiconductor chip are electrically connected with each other through the first and second interposers.

The first interposer may include first wiring lines electrically connecting one part of the first through electrodes with one part of the second through electrodes which correspond to the one part of the first through electrodes, and the second interposer may include second wiring lines electrically connecting an other part of the first through electrodes with an other part of the second through electrodes which correspond to the other part of the first through electrodes.

The first wiring lines may be formed over one surface of the first interposer which faces the first and second semiconductor chips.

Each of the first wiring line may include: a first connection pad electrically connected with each of the one part first through electrodes; a second connection pad electrically connected with each of one part second through electrodes corresponding to the one part first through electrodes; and a first trace electrically connecting the first connection pad and the second connection pad with each other.

The first interposer may further include: third connection pads formed over the one surface and electrically connected with the other part of the first through electrodes; and fourth connection pads formed over the one surface and electrically connected with the other part of the second through electrodes which correspond to the other part of the first through electrodes.

The first interposer may further include: first through vias passing through the one surface and an other surface of the first interposer which faces away from the one surface of the first interposer, and is electrically connected with the first connection pads; second through vias passing through the one surface and the other surface, and electrically connected with the second connection pads; third through vias passing through the one surface and the other surface, and electrically connected with the third connection pads; and fourth through vias passing through the one surface and the other surface, and electrically connected with the fourth connection pads.

The first interposer may further include a first passivation layer formed substantially over the one surface in such a way as to cover first traces and expose the first to fourth connection pads.

The semiconductor package may further include conductive connection members formed between the one part of the first through electrodes of the first semiconductor chip and the first connection pads of the first interposer, between the one part of the second through electrodes of the second semiconductor chip corresponding to the one part first through electrodes and the second connection pads of the first interposer, between the other part of the first through electrodes of the first semiconductor chip and the third connection pads of the first interposer, and between the other part of the second through electrodes of the second semiconductor chip corresponding to the other part of the first through electrodes and the fourth connection pads of the first interposer.

The second wiring lines may be formed over a first surface of the second interposer which faces the first and second semiconductor chips.

Each of the second wiring line may include: a fifth connection pad electrically connected with each of the other part of the first through electrodes; a sixth connection pad electrically connected with each of the other part of the second through electrodes corresponding to the other part of the first through electrodes; and a second trace electrically connecting the fifth connection pad and the sixth connection pad with each other.

The second interposer may further include: seventh connection pads formed over the first surface and electrically connected with the one part of the first through electrodes; and eighth connection pads formed over the one surface and electrically connected with the one part of the second through electrodes which correspond to the one part of the first through electrodes.

The second interposer may further include: a second passivation layer formed over the first surface in such a way as to substantially cover second traces and expose the fifth to eighth connection pads.

The semiconductor package may further include conductive connection members formed between the other part of the first through electrodes of the first semiconductor chip and the fifth connection pads of the second interposer, between the other part of the second through electrodes of the second semiconductor chip corresponding to the other part of the first through electrodes and the sixth connection pads of the second interposer, between the one part of the first through electrodes of the first semiconductor chip and the seventh connection pads of the second interposer, and between the one part of the second through electrodes of the second semiconductor chip corresponding to the one part of the first through electrodes and the eighth connection pads of the second interposer.

The first semiconductor chip and the second semiconductor chip may be different kinds of chips. For example, the first semiconductor chip may be a memory chip, and the second semiconductor chip may be a system chip.

At least two first semiconductor chips may be stacked such that their first through electrodes are connected with each other. Further, at least two second semiconductor chips may be stacked such that their second through electrodes are connected with each other.

The semiconductor package may further include a structural body supporting the first interposer and having connection electrodes which are electrically connected with the first to fourth through vias of the first interposer.

The structural body may include any one of a printed circuit board and a semiconductor package.

The semiconductor package may further include an additional semiconductor chip interposed between the first interposer and the structural body, and having additional through electrodes which electrically connect the first to fourth through vias of the first interposer and the connection electrodes of the structural body. The additional semiconductor chip may be a memory chip or a system chip.

The second interposer may further include additional through vias passing through a first surface of the second interposer which faces the first and second semiconductor chips and a second surface of the second interposer which faces away from the first surface, and is electrically connected with the first and second through electrodes of the first and second semiconductor chips. Further, the semiconductor package may further include an additional semiconductor chip stacked over the second surface of the second interposer and having additional bonding pads which are electrically connected with the additional through vias of the second interposer. The additional semiconductor chip may be a memory chip or a system chip.

DETAILED DESCRIPTION

Hereafter, various embodiments will be described in detail with reference to the accompanying drawings.

It is to be understood herein that the drawings are not necessarily to scale and in some instances proportions may have been exaggerated in order to more clearly depict certain features of the invention.

Figure 1:
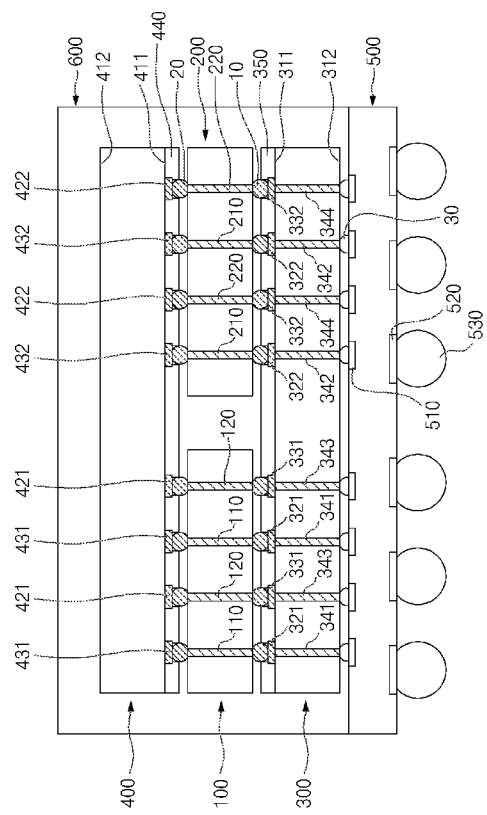
FIG. 1 is a cross-sectional view illustrating a semiconductor package in accordance with an embodiment.
Figure 2:
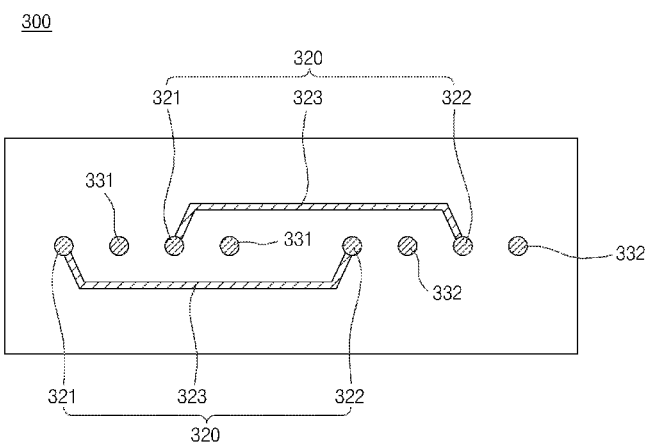
FIG. 2 is a plan view of the first interposer shown in FIG. 1.
Figure 3:
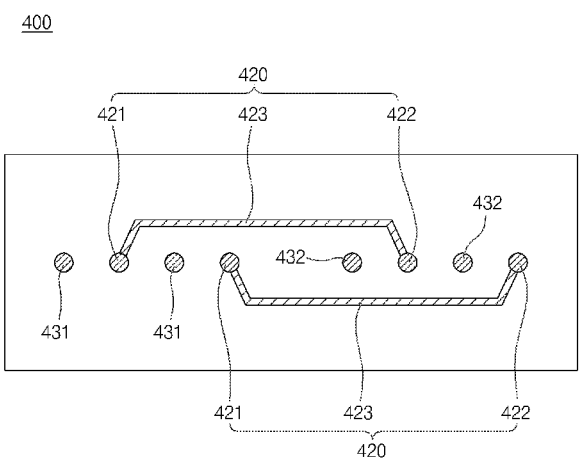
FIG. 3 is a plan view of the second interposer shown in FIG. 1.

FIG. 1 is a cross-sectional view illustrating a semiconductor package in accordance with an embodiment, FIG. 2 is a plan view of the first interposer shown in FIG. 1, and FIG. 3 is a plan view of the second interposer shown in FIG. 1.

Referring to FIG. 1, a semiconductor package in accordance with an embodiment may include a first semiconductor chip 100, a second semiconductor chip 200, a first interposer 300, and a second interposer 400. Additionally, the semiconductor package may further include a structural body 500, and a molding part 600.

The first semiconductor chip 100 may have a plurality of first through electrodes 110 and 120, and the second semiconductor chip 200 may have a plurality of second through electrodes 210 and 220 which respectively correspond to the first through electrodes 110 and 120. Although, it is not drawn in the drawings, the first semiconductor chip 100 may further have a plurality of third electrodes which is not necessarily electrically connected with the second semiconductor chip 200 such as through electrodes for providing VDD or VSS voltage, etc. Also, the second semiconductor chip 200 may further have a plurality of fourth electrodes which is not necessarily electrically connected with the first semiconductor chip 100.

The first semiconductor chip 100 and the second semiconductor chip 200 may be different kinds of chips. For example, the first semiconductor chip 100 may be a system chip, and the second semiconductor chip 200 may be a memory chip. Additionally, the first semiconductor chip 100 and the second semiconductor chip 200 may be the same kind of chips.

The first semiconductor chip 100 and the second semiconductor chip 200 may be horizontally mounted on the first interposer 300.

Referring to FIGS. 1 and 2, the first interposer 300 has one surface 311 which faces the first and second semiconductor chips 100 and 200 and the other surface 312 which faces away from the one surface 311, and may include first wiring lines 320. Additionally, the first interposer 300 further may include third and fourth connection pads 331 and 332, first to fourth through vias 341, 342, 343 and 344, and a first passivation layer 350.

The respective first wiring lines 320 may be formed on the one surface 311 of the first interposer 300, and electrically connect one part of the first through electrodes 110 of the first through electrodes 110 and 120 of the first semiconductor chip 100 with one part of the second through electrodes 210 of the second through electrodes 210 and 220 of the second semiconductor chip 200 which respectively correspond to the one part of the first through electrodes 110.

The first wiring lines 320 may include first connection pads 321, second connection pads 322, and first traces 323.

The first connection pads 321 may be electrically connected with the respective one part of the first through electrodes 110 of the first semiconductor chip 100, and the second connection pads 322 may be electrically connected with the respective one part of the second through electrodes 210 of the second semiconductor chip 200 which respectively correspond to the one part of the first through electrodes 110. The first traces 323 electrically connect the first connection pads 321 and the second connection pads 322 with each other.

The third connection pads 331 may be formed on the one surface 311 of the first interposer 300 and may be electrically connected with the other part of the first through electrodes 120, respectively, excluding the one part of the first through electrodes 110. The fourth connection pads 332 may be formed on the one surface 311 of the first interposer 300 and may be electrically connected with the other part of the second through electrodes 220 of the second semiconductor chip 200, which respectively correspond to the other part first of the through electrodes 120.

The first through vias 341 pass through the one surface 311 and the other surface 312 of the first interposer 300 and may be electrically connected with the respective first connection pads 321, and the second through vias 342 pass through the one surface 311 and the other surface 312 of the first interposer 300 and may be electrically connected with the respective second connection pads 322. The third through vias 343 pass through the one surface 311 and the other surface 312 of the first interposer 300 and may be electrically connected with the respective third connection pads 331, and the fourth through vias 344 pass through the one surface 311 and the other surface 312 of the first interposer 300 and may be electrically connected with the respective fourth connection pads 332.

The first passivation layer 350 may be formed on the one surface 311 of the first interposer 300 in such a way as to substantially cover the first traces 323 and expose the first to fourth connection pads 321, 322, 331, and 332.

Conductive connection members 10 may be formed between the one part of the first through electrodes 110 of the first semiconductor chip 100 and the first connection pads 321 of the first interposer 300, between the one part of the second through electrodes 210 of the second semiconductor chip 200 corresponding to the one part of the first through electrodes 110 and the second connection pads 322 of the first interposer 300, between the other part of the first through electrodes 120 of the first semiconductor chip 100 and the third connection pads 331 of the first interposer 300, and between the other part of the second through electrodes 220 of the second semiconductor chip 200 corresponding to the other part of the first through electrodes 120 and the fourth connection pads 332 of the first interposer 300. The conductive connection members 10 may include any one of solders and bumps.

Referring to FIGS. 1 and 3, the second interposer 400 may be disposed on the first and second semiconductor chips 100 and 200.

The second interposer 400 may have a first surface 411 which faces the first and second semiconductor chips 100 and 200 and a second surface 412 which faces away from the first surface 411, and may include second wiring lines 420. Also, the second interposer 400 further may include seventh and eighth connection pads 431 and 432, and a second passivation layer 440.

The second wiring lines 420 may be formed on the first surface 411 of the second interposer 400, and electrically connect the other part of the first through electrodes 120 of the first semiconductor chip 100 with the other part of the second through electrodes 220 of the second semiconductor chip 200 which respectively correspond to the other part of the first through electrodes 120.

The second wiring lines 420 may include fifth connection pads 421, sixth connection pads 422, and second traces 423.

The fifth connection pads 421 may be electrically connected with the respective other part of the first through electrodes 120 of the first semiconductor chip 100, and the sixth connection pads 422 may be electrically connected with the respective other part of the second through electrodes 220 of the second semiconductor chip 200 which respectively correspond to the other part of the first through electrodes 120. The second traces 423 electrically connect the fifth connection pads 421 and the sixth connection pads 422 with each other.

The seventh connection pads 431 may be formed on the first surface 411 of the second interposer 400 and may be electrically connected with the one part of the first through electrodes 110 of the first semiconductor chip 100. The eighth connection pads 432 may be formed on the first surface 411 of the first interposer 300 and may be electrically connected with the one part of the second through electrodes 210 of the second semiconductor chip 200, which respectively correspond to the one part of the first through electrodes 110.

The second passivation layer 440 may be formed on the one surface 411 of the second interposer 400 in such a way as to substantially cover the second traces 423 and expose the fifth to eighth connection pads 421, 422, 431, and 432.

Conductive connection members 20 may be formed between the other part of the first through electrodes 120 of the first semiconductor chip 100 and the fifth connection pads 421 of the second interposer 400, between the other part of the second through electrodes 220 of the second semiconductor chip 200 corresponding to the other part of the first through electrodes 120 and the sixth connection pads 422 of the second interposer 400, between the one part of the first through electrodes 110 of the first semiconductor chip 100 and the seventh connection pads 431 of the second interposer 400, and between the one part of the second through electrodes 210 of the second semiconductor chip 200 corresponding to the one part of the first through electrodes 110 and the eighth connection pads 432 of the second interposer 400. The conductive connection members 20 may include any one of solders and bumps.

Referring back to FIG. 1, the structural body 500 may support the first interposer 300. Connection electrodes 510, which may be electrically connected with the first to fourth through vias 341, 342, 343 and 344 of the first interposer 300, may be formed on the upper surface of the structural body 500 which faces the first interposer 300, and ball lands 520 may be formed on the lower surface of the structural body 500. In an embodiment, the structural body 500 may be formed as a printed circuit board (PCB).

The first to fourth through vias 341, 342, 343, and 344 of the first interposer 300 and the connection electrodes 510 of the structural body 500 may be electrically connected with each other by conductive connection members 30, and the upper surface of the structural body 500 including the first and second semiconductor chips 100 and 200 and the first and second interposers 300 and 400 may be sealed by the molding part 600. The reference numeral 530 of FIG. 1 may designate solder balls which may be used as external connection terminals.

Figure 4:
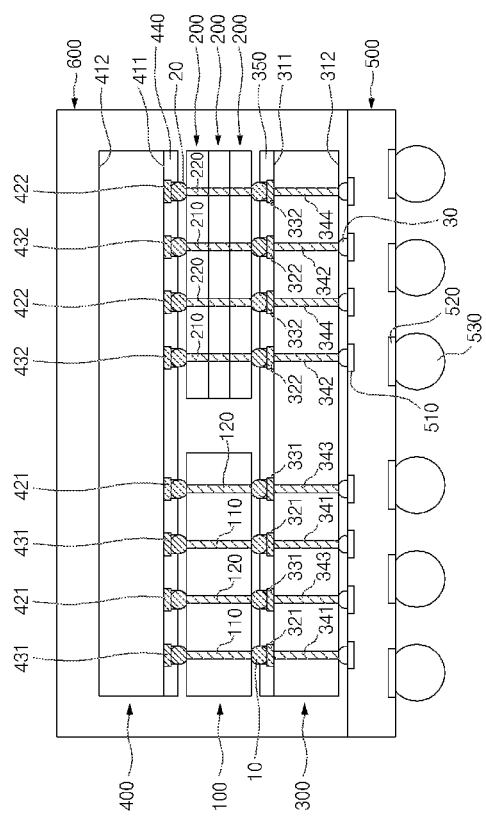
FIG. 4 is a cross-sectional view illustrating a semiconductor package in accordance with an embodiment.

FIG. 4 is a cross-sectional view illustrating a semiconductor package in accordance with an embodiment.

Unlike the semiconductor package in accordance with an embodiment described above with reference to FIGS. 1 to 3, the semiconductor package in accordance with an embodiment associated with FIG. 4 may have a construction where the second semiconductor packages 200 may be stacked in plural. Accordingly, since the semiconductor package in accordance with an embodiment associated with FIG. 4 has substantially the same construction as the semiconductor package in accordance with the embodiments associated with FIGS. 1 to 3 except the second semiconductor packages 200, repeated descriptions for the same component parts will be omitted herein, and the same terms and the same reference numerals will be used to refer to the same component parts.

Referring to FIG. 4, three second semiconductor chips 200 may be vertically stacked on a first interposer 300 such that second through electrodes 210 and 220 may be connected with one another, and the fourth electrodes (not drawn) may be connected with one another.

Although it is illustrated and described in an embodiment that the three second semiconductor chips 200 are stacked, it is to be noted that the embodiments are not limited to such and may include all cases in which at least two second semiconductor chips 200 may be stacked.

Figure 5:
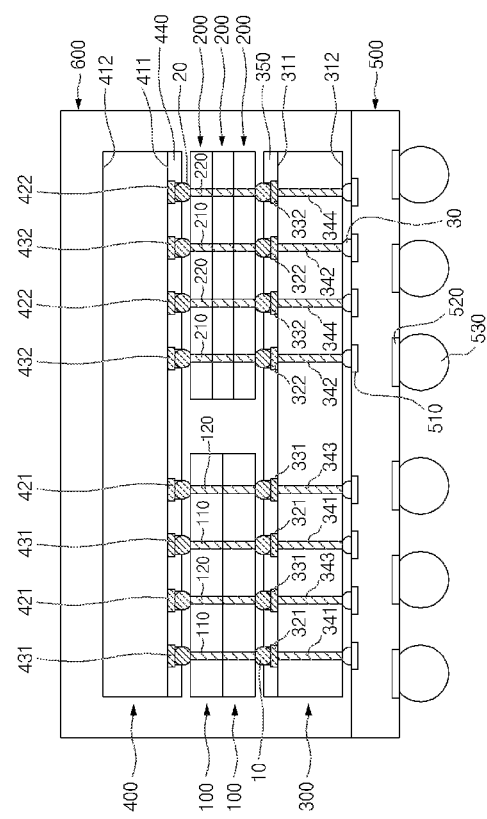
FIG. 5 is a cross-sectional view illustrating a semiconductor package in accordance with an embodiment.

FIG. 5 is a cross-sectional view illustrating a semiconductor package in accordance with a third an embodiment.

Unlike the semiconductor package in accordance with the embodiments described above with reference to FIG. 4, the semiconductor package in accordance with an embodiment associated with FIG. 5 may have a construction where the first semiconductor packages 100 may be stacked in plural. Accordingly, since the semiconductor package in accordance with the embodiments associated with FIG. 5 have substantially the same construction as the semiconductor package in accordance with the embodiments associated with FIG. 4 except the first semiconductor packages 100, repeated descriptions for the same component parts will be omitted herein, and the same terms and the same reference numerals will be used to refer to the same component parts.

Referring to FIG. 5, two first semiconductor chips 100 may be vertically stacked on a first interposer 300 such that first through electrodes 110 and 120 may be connected with each other, and the third electrodes (not drawn) may be connected with one another.

Although it is illustrated and described in the embodiments that the two first semiconductor chips 100 are stacked, it is to be noted that the embodiments are not limited to such and may include all cases in which at least two first semiconductor chips 100 may be stacked.

Figure 6:
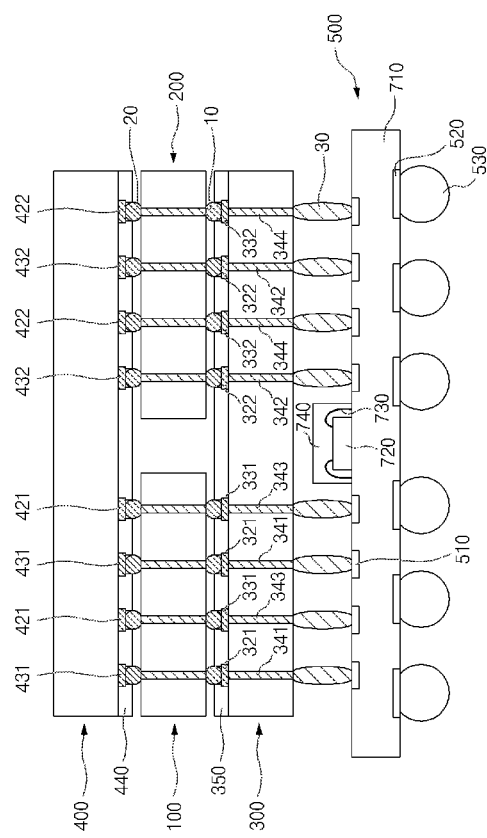
FIG. 6 is a cross-sectional view illustrating a semiconductor package in accordance with an embodiment.

FIG. 6 is a cross-sectional view illustrating a semiconductor package in accordance with an embodiment.

The semiconductor package in accordance with an embodiment associated with FIG. 6 may have a construction where the structural body 500 in the semiconductor package in accordance with the embodiments described above with reference to FIGS. 1 to 3 is changed to a semiconductor package from a printed circuit board. Accordingly, since the semiconductor package in accordance with the embodiments associated with FIG. 6 have substantially the same construction as the semiconductor package in accordance with the embodiments associated with FIGS. 1 to 3 except the structural body 500, the same terms and the same reference numerals will be used to refer to the same component parts.

Referring to FIG. 6, a structural body 500 may be formed as a semiconductor package.

The semiconductor package may include a substrate 710 which has connection electrodes 510 on the upper surface thereof and ball lands 520 on the lower surface thereof, and a third semiconductor chip 720 which is attached to the upper surface of the substrate 710 between the connection electrodes 510. The third semiconductor chip 720 is electrically connected with the substrate 710 using wires 730, and may be fixed by a molding part 740. The reference numeral 530 may designate external connection terminals which may be mounted to the ball lands 520 of the substrate 710.

First to fourth through vias 341, 342, 343, and 344 of a first interposer 300 and the connection electrodes 510 of the substrate 710 may be electrically connected by conductive connection members 30.

In an embodiment, the conductive connection members 30 may be formed as solder balls. Additionally, the conductive connection members 30 may be formed as lead wires.

Figure 7:
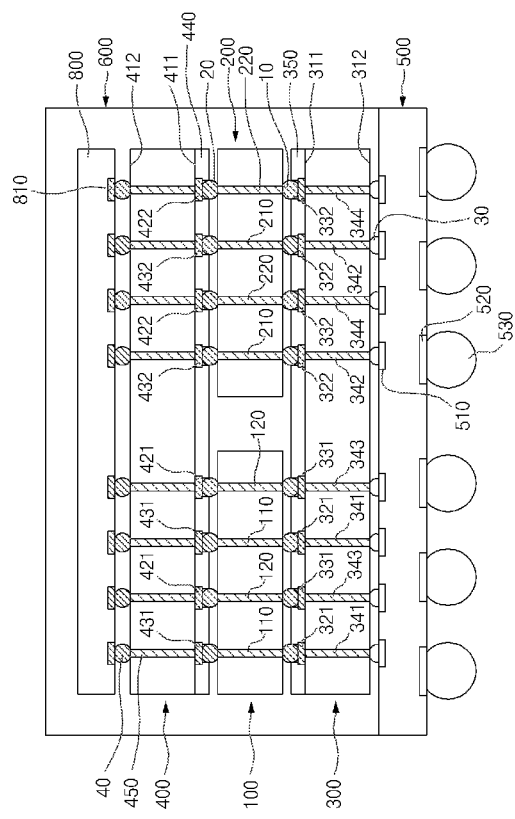
FIG. 7 is a cross-sectional view illustrating a semiconductor package in accordance with an embodiment.

FIG. 7 is a cross-sectional view illustrating a semiconductor package in accordance with an embodiment.

The semiconductor package in accordance with an embodiment associated with FIG. 7 may have a construction where an additional semiconductor chip 800 may be additionally stacked on the second interposer 400 in the semiconductor package in accordance with the embodiments described above with reference to FIGS. 1 to 3 and additional through vias 450 may be formed through the second interposer 400. Accordingly, since the semiconductor package in accordance with the embodiments associated with FIG. 7 has substantially the same construction as the semiconductor package in accordance with the embodiments associated with FIGS. 1 to 3 except the additional semiconductor chip 800 and the second interposer 400, the same terms and the same reference numerals will be used to refer to the same component parts.

Referring to FIG. 7, a second interposer 400 may include additional through vias 450 which pass through a first surface 411 facing first and second semiconductor chips 100 and 200 and a second surface 412 facing away from the first surface 411 and may be electrically connected with fifth to eighth connection pads 421, 422, 431, and 432.

Further, an additional semiconductor chip 800, with additional bonding pads 810 which are respectively electrically connected with the additional through vias 450, may be stacked on the second surface 412 of the second interposer 400. The additional semiconductor chip 800 may be a system chip or a memory chip.

Conductive connection members 40 may be formed between the additional through vias 450 of the second interposer 400 and the additional bonding pads 810 of the additional semiconductor chip 800, and may electrically connect the additional through vias 450 of the second interposer 400 with the additional bonding pads 810 of the additional semiconductor chip 800.

Figure 8:
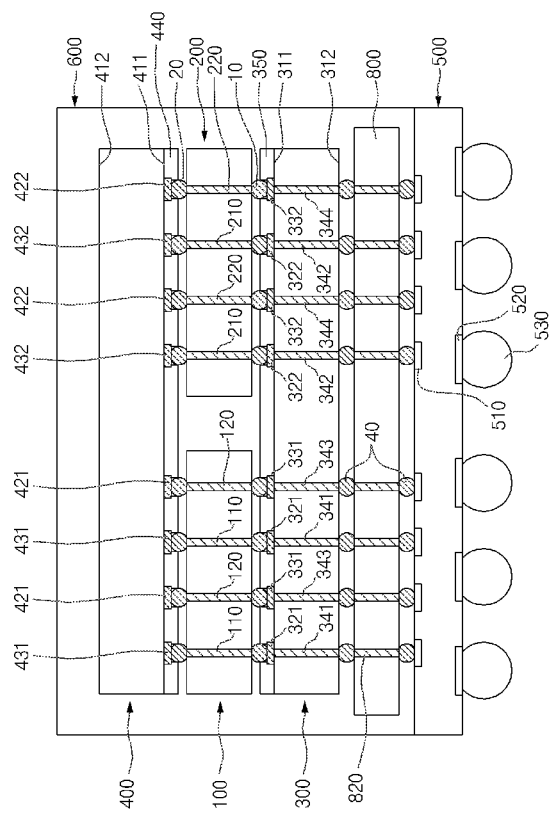
FIG. 8 is a cross-sectional view illustrating a semiconductor package in accordance with an embodiment.

FIG. 8 is a cross-sectional view illustrating a semiconductor package in accordance with an embodiment.

The semiconductor package in accordance with an embodiment associated with FIG. 8 may have a construction where an additional semiconductor chip 800 is added between the first interposer 300 and the structural body 500 in the semiconductor package in accordance with the embodiments described above with reference to FIGS. 1 to 3. Accordingly, since the semiconductor package in accordance with the embodiments associated with FIG. 8 have substantially the same construction as the semiconductor package in accordance with the embodiments associated with FIGS. 1 to 3 except the additional semiconductor chip 800, the same terms and the same reference numerals will be used to refer to the same component parts.

Referring to FIG. 8, an additional semiconductor chip 800 may be interposed between a first interposer 300 and a structural body 500.

The additional semiconductor chip 800 has one surface which faces the first interposer 300 and the other surface which faces away from the one surface and faces the structural body 500, and may include additional through electrodes 820 which pass through the one surface and the other surface and electrically connect first to fourth through vias 341, 342, 343 and 344 of the first interposer 300 with connection electrodes 510 of the structural body 500. The additional semiconductor chip 800 may be a system chip or a memory chip.

Conductive connection members 40 may be formed between the additional through electrodes 820 of the additional semiconductor chip 800 and the first to fourth through vias 341, 342, 343, and 344 of the first interposer 300 and between the additional through electrodes 820 of the additional semiconductor chip 800 and the connection electrodes 510 of the structural body 500. The conductive connection members 40 electrically connect the additional through electrodes 820 of the additional semiconductor chip 800 with the first to fourth through vias 341, 342, 343, and 344 of the first interposer 300 and electrically connect the additional through electrodes 820 of the additional semiconductor chip 800 with the connection electrodes 510 of the structural body 500.

The aforementioned semiconductor packages may be applied to various electronic apparatuses.

Figure 9:
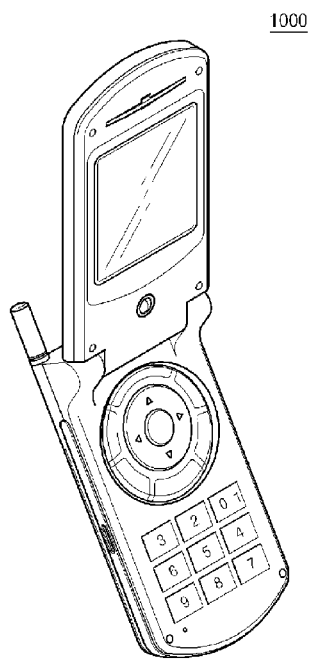
FIG. 9 is a perspective view illustrating an electronic apparatus having the semiconductor package according to an embodiment.

FIG. 9 is a perspective view illustrating an electronic apparatus having the semiconductor package according to the various embodiments.

Referring to FIG. 9, the semiconductor package according to the various embodiments may be applied to an electronic apparatus 1000 such as a portable phone. Since the semiconductor package according to the embodiments provides advantages in that it is easy to increase the number of inputs/outputs, advantages are provided for multi-functionality and high integration. The electronic apparatus 1000 is not limited to the portable phone shown in FIG. 9, and may include various electronic appliances, for example, such as a mobile electronic appliance, a laptop computer, a notebook computer, a portable multimedia player (PMP), an MP3 player, a camcorder, a web tablet, a wireless phone, a navigator, a personal digital assistant (PDA), and so forth.

Figure 10:
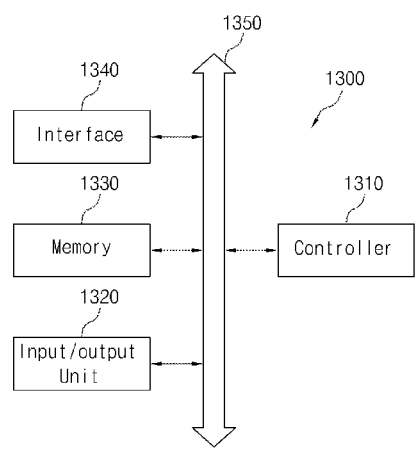
FIG. 10 is a system block diagram showing an electronic apparatus to which the semiconductor package according to an embodiment is applied.

FIG. 10 is a block diagram showing an example of the electronic apparatus having the semiconductor package according to the various embodiments.

Referring to FIG. 10, an electronic system 1300 may include a controller 1310, an input/output unit 1320, and a memory 1330. The controller 1310, the input/output unit 1320 and the memory 1330 may be coupled with one another through a bus 1350. The bus 1350 serves as a path through which data move. For example, the controller 1310 may include at least any one of at least one microprocessor, at least one digital signal processor, at least one microcontroller, and logic devices capable of performing the same functions as these components. The controller 1310 and the memory 1330 may include the semiconductor package according to the present invention. The input/output unit 1320 may include at least one selected among a keypad, a keyboard, a display device, and so forth. The memory 1330 is a device for storing data. The memory 1330 may store data and/or commands to be executed by the controller 1310, and the likes. The memory 1330 may include a volatile memory device and/or a nonvolatile memory device. Otherwise, the memory 1330 may be constituted by a flash memory. For example, a flash memory to which the technology of the present invention is applied may be mounted to an information processing system such as a mobile terminal or a desk top computer. The flash memory may be constituted by a solid state drive (SSD). In this case, the electronic system 1300 may stably store a large amount of data in a flash memory system. The electronic system 1300 may further may include an interface 1340 configured to transmit and receive data to and from a communication network. The interface 1340 may be a wired or wireless type. For example, the interface 1340 may include an antenna or a wired or wireless transceiver. Further, while not shown, a person skilled in the art will readily appreciate that the electronic system 1300 may be additionally provided with an application chipset, a camera image processor (CIS), an input/output unit, etc.

As is apparent from the above description, according to the various embodiments, since an area for forming wiring lines is sufficiently secured, the number of inputs/outputs that has been limited due to insufficiency of an area for forming wiring lines may be increased, whereby it is possible to accomplish multi-functionality and high integration.

Although various embodiments have been described for illustrative purposes, those skilled in the art will appreciate that various modifications, additions, and substitutions are possible, without departing from the scope and the spirit of the invention as disclosed in the accompanying claims.

What is claimed is:

1. A semiconductor package comprising:
   a first interposer;
   first and second semiconductor chips horizontally mounted over the first interposer and electrically connected with the first interposer; and
   a second interposer disposed over the first and second semiconductor chips and electrically connected with the first and second semiconductor chips which are horizontally mounted over the first interposer,
   wherein the first semiconductor chip includes a plurality of first through electrodes, and the second semiconductor chip includes a plurality of second through electrodes,
   wherein the first through electrodes of the first semiconductor chip and the second through electrodes of the second semiconductor chip are electrically connected with each other through the first and second interposers, and
   wherein the first interposer comprises first wiring lines electrically connecting one part of the first through electrodes with one part of the second through electrodes which correspond to the one part of the first through electrodes, and the second interposer comprises second wiring lines electrically connecting another part of the first through electrodes with another part of the second through electrodes which correspond to the other part of the first through electrodes.

2. The semiconductor package according to claim 1, wherein the first wiring lines are formed over one surface of the first interposer which faces the first and second semiconductor chips.

3. The semiconductor package according to claim 2, wherein each first wiring line comprises:
   a first connection pad electrically connected with each of the one part of the first through electrodes;

a second connection pad electrically connected with each of the one part of the second through electrodes corresponding to the one part of the first through electrodes; and a first trace electrically connecting the first connection pad and the second connection pad with each other.

4. The semiconductor package according to claim 3, wherein the first interposer further comprises:
   third connection pads formed over the one surface and electrically connected with the other part of the first through electrodes; and
   fourth connection pads formed over the one surface and electrically connected with the other part of the second through electrodes which correspond to the other part of the first through electrodes.

5. The semiconductor package according to claim 4, wherein the first interposer further comprises:
   first through vias passing through the one surface and an other surface of the first interposer which faces away from the one surface of the first interposer, and is electrically connected with the first connection pads;
   second through vias passing through the one surface and the other surface, and electrically connected with the second connection pads;
   third through vias passing through the one surface and the other surface, and electrically connected with the third connection pads; and
   fourth through vias passing through the one surface and the other surface, and electrically connected with the fourth connection pads.

6. The semiconductor package according to claim 4, wherein the first interposer further comprises:
   a first passivation layer formed over the one surface in such a way as to substantially cover first traces and expose the first to fourth connection pads.

7. The semiconductor package according to claim 1, wherein the second wiring lines are formed over a first surface of the second interposer which faces the first and second semiconductor chips.

8. The semiconductor package according to claim 7, wherein each second wiring line comprises:
   a fifth connection pad electrically connected with each of the other part of the first through electrodes;
   a sixth connection pad electrically connected with each of the other part of the second through electrodes corresponding to the other part of the first through electrodes; and
   a second trace electrically connecting the fifth connection pad and the sixth connection pad with each other.

9. The semiconductor package according to claim 8, wherein the second interposer further comprises:
   seventh connection pads formed over the first surface and electrically connected with the one part of the first through electrodes; and
   eighth connection pads formed over the one surface and electrically connected with the one part of the second through electrodes which correspond to the one part of the first through electrodes.

10. The semiconductor package according to claim 9, wherein the second interposer further comprises:
    a second passivation layer formed over the first surface in such a way as to substantially cover second traces and expose the fifth to eighth connection pads.

11. The semiconductor package according to claim 1, wherein the first semiconductor chip and the second semiconductor chip are different kinds of chips.

12. The semiconductor package according to claim 11, wherein the first semiconductor chip is a memory chip, and the second semiconductor chip is a system chip.

13. The semiconductor package according to claim 1, wherein at least two first semiconductor chips are stacked such that their first through electrodes are connected with each other.

14. The semiconductor package according to claim 1, wherein at least two second semiconductor chips are stacked such that their second through electrodes are connected with each other.

15. The semiconductor package according to claim 5, further comprising:
    a structural body supporting the first interposer and having connection electrodes which are electrically connected with the first to fourth through electrodes of the first interposer.

16. The semiconductor package according to claim 15, wherein the structural body comprises any one of a printed circuit board and a semiconductor package.

17. The semiconductor package according to claim 15, further comprising:
    an additional semiconductor chip interposed between the first interposer and the structural body, and having additional through electrodes which electrically connect the first to fourth through electrodes of the first interposer and the connection electrodes of the structural body.

18. The semiconductor package according to claim 1, wherein the second interposer further comprises:
    additional through vias passing through a first surface of the second interposer which faces the first and second semiconductor chips and a second surface of the second interposer which faces away from the first surface, and is electrically connected with the first and second through electrodes of the first and second semiconductor chips.

19. The semiconductor package according to claim 18, further comprising:
    an additional semiconductor chip stacked over the second surface of the second interposer and having additional bonding pads which are electrically connected with the additional through vias of the second interposer.

* * * * *